United States Patent [19]

Thompson et al.

[11] Patent Number: 5,085,560
[45] Date of Patent: Feb. 4, 1992

[54] LOW CONTAMINATION BLENDING AND METERING SYSTEMS FOR SEMICONDUCTOR PROCESSING

[75] Inventors: Raymon F. Thompson; Aleksander Owczarz, both of Kalispell, Mont.

[73] Assignee: Semitool, Inc., Kalispell, Mont.

[21] Appl. No.: 464,101

[22] Filed: Jan. 12, 1990

[51] Int. Cl.$^5$ .......................... F04B 9/08; G01F 11/08
[52] U.S. Cl. ..................................... 417/53; 417/317; 417/472; 417/505; 222/135; 222/334
[58] Field of Search ............... 417/53, 317, 472, 505; 222/132, 135, 339

[56] References Cited

U.S. PATENT DOCUMENTS

| | | | |
|---|---|---|---|
| 2,774,364 | 12/1956 | Brobeil | 417/317 X |
| 3,107,034 | 10/1963 | Dunnous | 222/334 X |
| 4,139,333 | 2/1979 | Sipos | 417/472 X |
| 4,344,743 | 8/1982 | Bessman et al. | 417/317 |
| 4,437,812 | 3/1984 | Abu-Shumays et al. | 417/53 |
| 4,475,665 | 10/1984 | Norton | 222/334 X |
| 4,483,665 | 11/1984 | Hauser | 417/472 X |
| 4,580,699 | 4/1986 | Black et al. | 222/135 X |
| 4,832,580 | 5/1989 | Tsuyoshi et al. | 417/317 X |
| 4,863,066 | 9/1989 | Uffenheimer et al. | 222/334 X |

Primary Examiner—John Rivell
Attorney, Agent, or Firm—Wells, St. John & Roberts

[57] ABSTRACT

Blending and pumping systems for accurately delivering desired amounts of processing fluids, particularly for use in semiconductor processing and semiconductor processors. Thee blending systems include one or more supply tanks from which a processing fluid is accurately pumped using the novel metering pump and associated pumping and blending methods. The blending systems preferably include a recycle line which includes a control valve which is controlled to recycle process fluid during an initial startup period. The outflow from the pump is preferably totally recycled during this startup period by blocking flow of process fluid to the blending container. The metering pump includes a pump housing having a pumping chamber which is partially defined by a displacement member, such as a flexible bellows structure. The pumping chamber is isolated from inlet and outlet via inlet and outlet valves, respectively. The inlet and outlet valves are positively controlled into open and closed positions using a control system which preferably includes an elctronic controller. The controller appropriately sequences the operation of the pump inlet and outlet valves relative to a displacement member actuator which drives the displacement member. The control is preferably accomplished by using electrically operated solenoid valves which control the flow of an intermediary control fluid, such as air or other suitable gas. The invention further includes methods of blending and pumping to provide accurate and low contamination of the process fluids being metered.

8 Claims, 6 Drawing Sheets

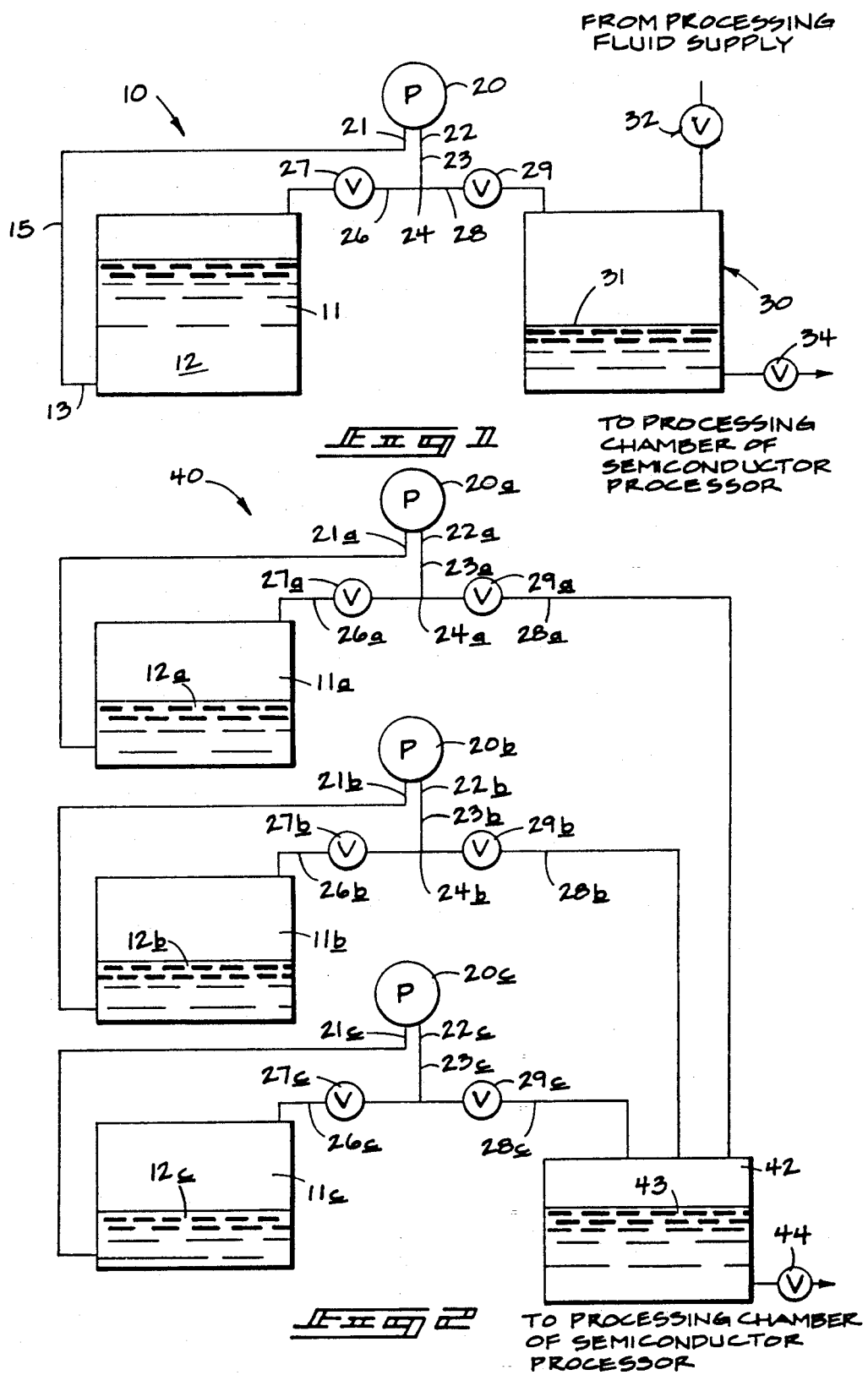

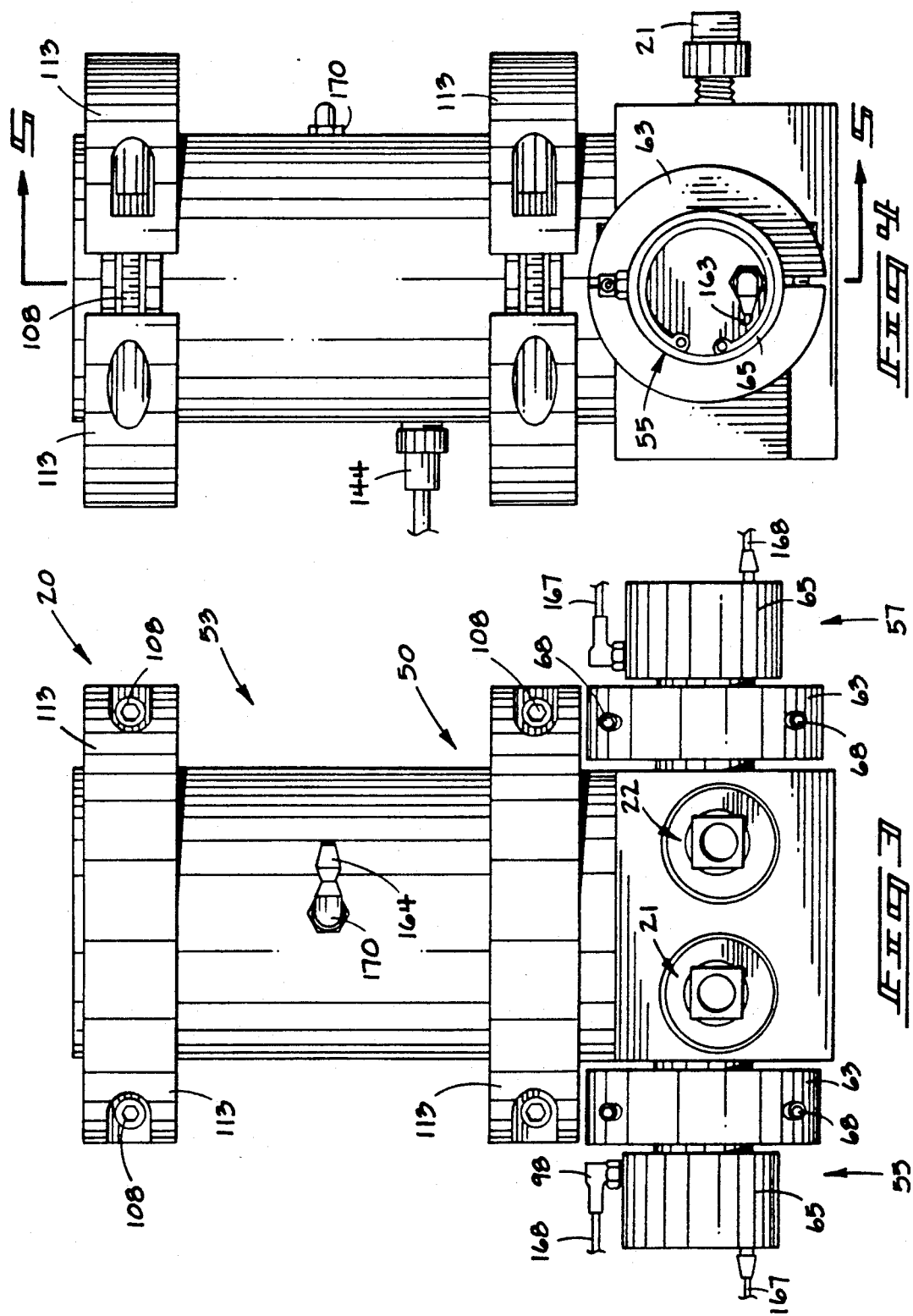

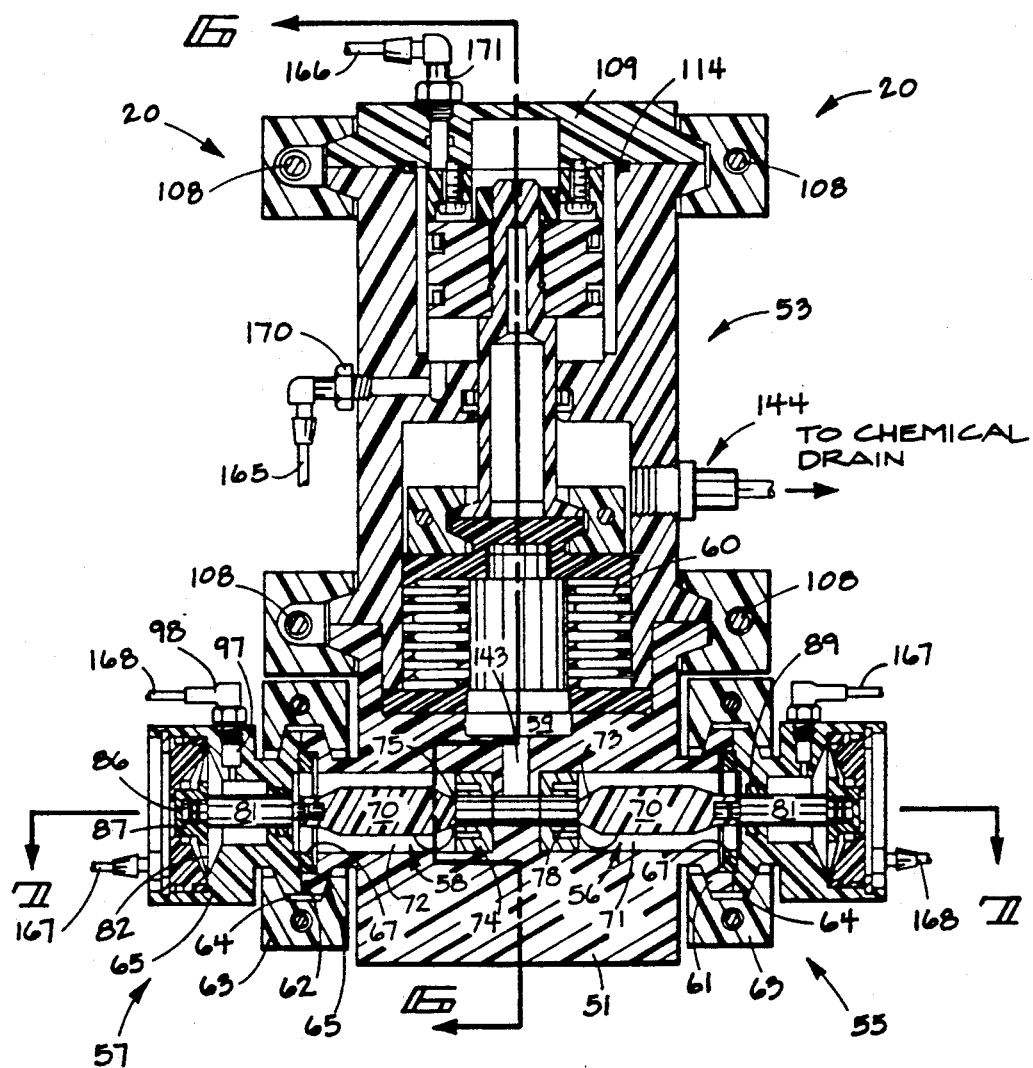

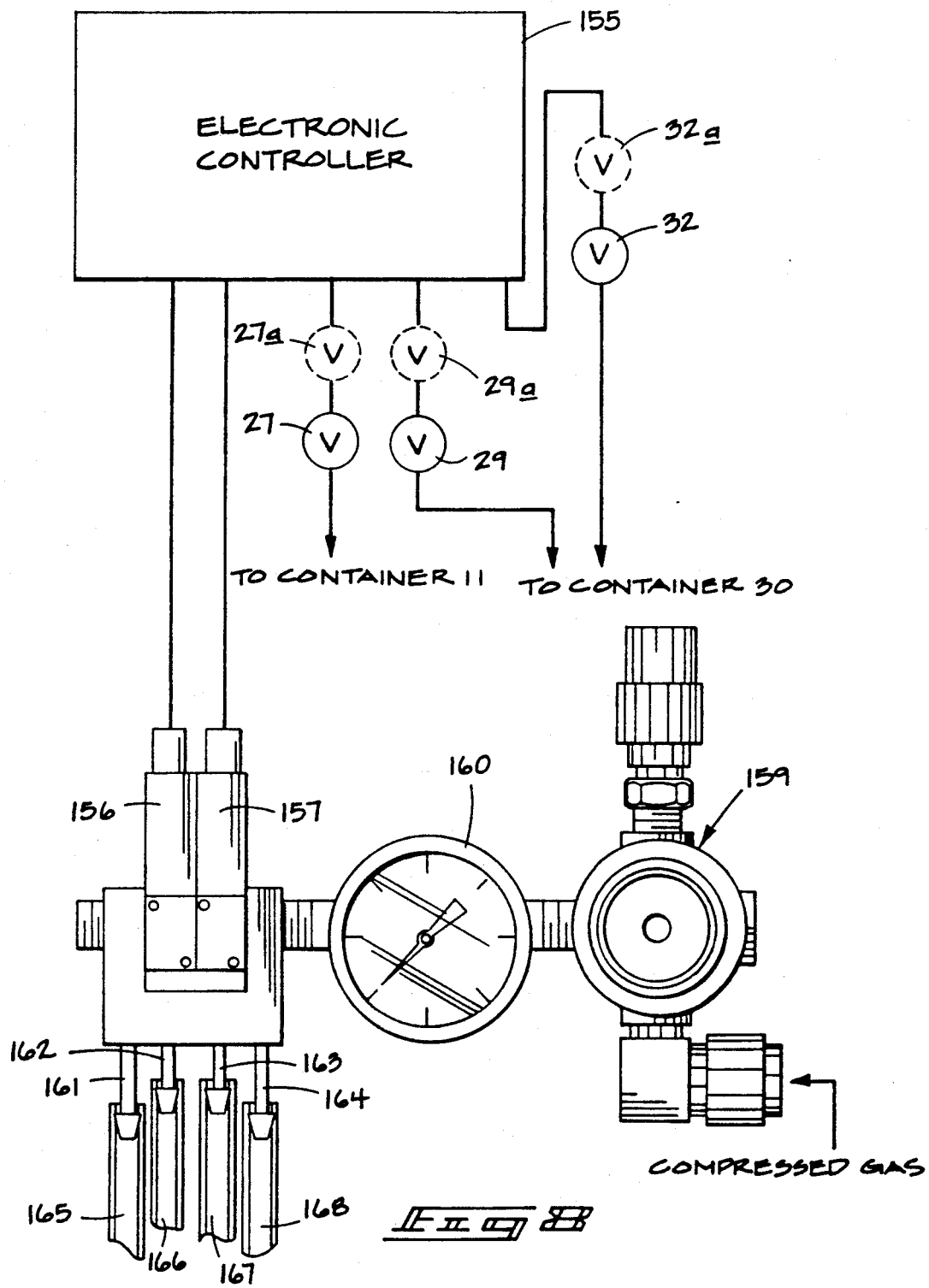

5,085,560

LOW CONTAMINATION BLENDING AND METERING SYSTEMS FOR SEMICONDUCTOR PROCESSING

TECHNICAL FIELD

The field of this invention is accurate blending and pumping apparatus and methods for delivery of liquid compositions, particularly those related to the processing of semiconductors.

BACKGROUND OF THE INVENTION

In semiconductor substrate processing it is often necessary to provide carefully blended processing fluids to a processing chamber in which semiconductor wafers, photomasks, and other similar products are being treated or processed. Blended processing fluids may, for example, include mixtures of hydrogen peroxide with sulfuric acid, ammonium hydroxide, water and other processing fluids. Similarly, hydrofluoric acid may need to be blended with water, acidic acid, nitric acid, phosphoric acid or other processing fluids.

Because of the relatively small size of semiconductor processors and the small number of articles typically processed at one time, the amounts of such processing fluids are relatively small. This requires that the metering of various constituents be done accurately to achieve the desired blend. Additionally, it is of utmost concern that the fluids be blended in a manner which does not add undesired contaminants to the processing fluids. Such contaminants can cause serious loss of wafer yields.

The desired blending of process fluids is particularly of significance in processing where the same group of chemicals may be used in varying processing steps in different concentrations and or combinations. Previously it has been difficult to achieve repeatable accurate blending of processing fluid components from one processing run to the next. Each time the processing fluid constituents are mixed there is a chance for variability due to operator error and simple inability to accurately control the amounts of chemicals being combined to produce the desired blended processing fluid. Thus the semiconductor industry has experienced a keen need for processing equipment which can be stocked with several different processing fluids and then provide automated blending of these fluids without operator judgement and manual control. Previous systems were unable to achieve the desired degree of blending accuracy and repeatability.

BRIEF DESCRIPTION OF THE DRAWINGS

One or more preferred embodiments of the invention are illustrated in the accompanying drawings, which are briefly described below.

FIG. 1 is a schematic drawing showing one form of blending system used in a preferred semiconductor processor made in accordance with this invention.

FIG. 2 is a schematic drawing showing another preferred blending system used in another preferred semiconductor processor made in accordance with the invention.

FIG. 3 is a front elevational view of a preferred pump used in the blending systems illustrated in FIGS. 1 and 2.

FIG. 4 is an end elevational view of the pump of FIG. 3.

FIG. 5 is a longitudinal sectional view taken along line 5—5 of FIG. 4.

FIG. 8 is a schematic drawing showing the interaction of the preferred electronic controller with other components of the preferred blending system shown in FIG. 1.

DETAILED DESCRIPTION OF THE PREFERRED EMBODIMENTS

Figure 6:
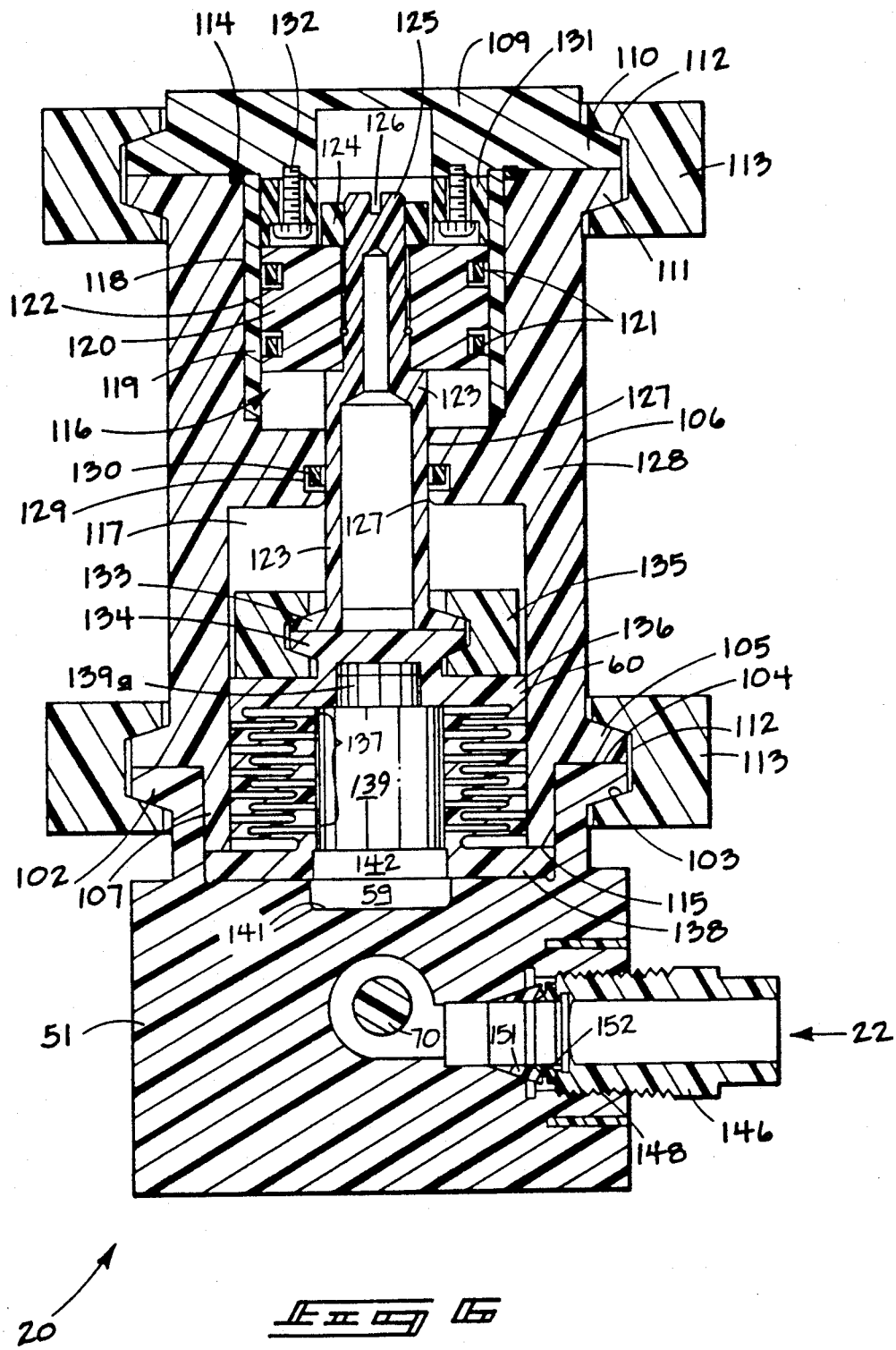
FIG. 6 is an enlarged transverse sectional view taken along line 6—6 of FIG. 5.

The following disclosure of the invention is submitted in furtherance with the constitutional purpose of the Patent Laws "to promote the progress of science and useful arts" (Article 1, Section 8).

FIG. 1 shows a semiconductor blending system 10 according to this invention. The blending system is advantageously included as a subsystem in a semiconductor processor not otherwise shown. A suitable example of semiconductor processor is an acid treatment processor (not shown). The blending system includes a first component supply container or reservoir 11 used to stock a desired first processing fluid 12. The reservoir can advantageously be positioned in a room adjacent to a laminar flow clean room to save floor space in these high cost production facilities. The processing fluid can be furnished in the reservoir container or supplied to a fixed reservoir in any suitable manner. The container has an outlet 13 through which process fluid 12 is withdrawn. The reservoir outlet 13 is connected to a pump supply conduit or line 15 which supplies metering pump 20. The supply line 15 is connected to the inlet 21 of pump 20. Pump 20 is a metering pump such as described hereinafter. The pump outlet 22 is connected to an outflow line or outflow conduit system 23. The outflow system is branched in a suitable manner such as at branch fitting 24 to allow controlled recycle to reservoir 11 and controlled delivery to either a blending container 30 or by recycle to supply container 11. The controlled recycle allows priming of pump 20 and related fluid conduits. The recycle line 26 is provided with a suitable recycle control valve 27 which controls the flow of fluid from outflow of pump 20 back to reservoir 11. Similarly, a blending tank conduit 28 is provided with a blending supply or delivery control valve 29. Alternatively, the branched connection 24 and control valves 27 and 29 can be integrated into a suitable two outlet (3-way) control valve known in the art.

The blending tank supply line 28 empties into the blending tank, reservoir or container 30. Blended processing fluid 31 is held within the blending container 30. The blended processing fluid 31 is a combination of the first processing fluid component 12 and a second processing fluid component which is supplied via a second component supply valve 32. The second component can be metered in an accurate manner using a subsystem incorporating parts equivalent to reservoir 11, pump 20, recycle valve 27, delivery valve 28, and associated parts as described herein. Alternatively, the second component of the blended processing fluid 31, can be the major component and supplied using a relatively less accurate supply system. For example, where an active ingredient is being diluted into water, the water may be appropriately supplied through valve 32 to a desired level, or otherwise measured without metering the entire flow as described hereinafter. Blended processing fluid 31 is controllably supplied to the processing chamber (not shown) of a semiconductor processor via blended product control valve 34.

FIG. 2 shows an alternative blending system 40 according to this invention. Blending system 40 is also designed as a subsystem to a semiconductor processor. Blending system 40 includes first, second and third processing fluid component reservoirs 11a, 11b, 11c, respectively, which are similar to reservoir 11 described hereinabove. Each fluid component 12a, 12b, and 12c is held therein and supplied through metering pumps 20a, 20b, and 20c, respectively. The inlets 21a, 21b, and 21c, and outlets 22a, 22b, and 22c intake and discharge the respective processing fluid components. Recycle of the first, second and third processing fluid components is accomplished through first, second and third recycle lines 26a-c, using first, second and third recycle control valves 27a-c, respectively. The processing fluid components are delivered to a blending tank 42 via the first, second and third blending reservoir supply or delivery lines 28a-c, as controlled by blending supply control valves 29a-c. The mixture, solution or other combination of the three processing fluid components produces the blended processing fluid 43 held within the blending container 42. Blended processing fluid 43 is controllably supplied to the processing chamber (not shown) of the semiconductor processor as controlled by blended product control valve 44.

FIGS. 3-7 show a preferred metering pump 20 useful in the processing fluid blending systems 10 and 40 and others according to this invention. Pump 20 includes a pump housing 50. As shown, pump housing 50 is advantageously constructed using a number of component parts which are assembled together. The pump housing includes a main pump housing or first body member 51. Attached to the primary pump housing member 51 is a pumping actuator assembly 53 and two valve actuator assemblies 55 and 57. The pumping actuator assembly 53 uses two controlled supplies of compressed air or other suitable actuation media which are utilized to move a bellows 60 to thus cause pumping action. Similarly, the inlet and outlet valve actuator assemblies 55 and 57 also use two controlled supplies of compressed air or other suitable media to controllably open and close inlet and outlet valve assemblies 56 and 58, respectively (see FIGS. 5 and 7). The inlet valve 56 is opened to allow the fluid being pumped to enter into a pumping chamber 59. Pumping chamber 59 is in part defined by the interior of the bellows 60 which acts as a displacement element for positively displacing the fluid being pumped. The inlet valve 55 is opened and the outlet valve 57 is closed during the intake cycle wherein expansionary motion of bellows 60 occurs to thus draw fluid into pumping chamber 59. The outlet valve 57 is opened and the inlet valve 55 is closed during contractionary motion of bellows 60 to thus pump the fluid from pumping chamber 59.

Figure 7:
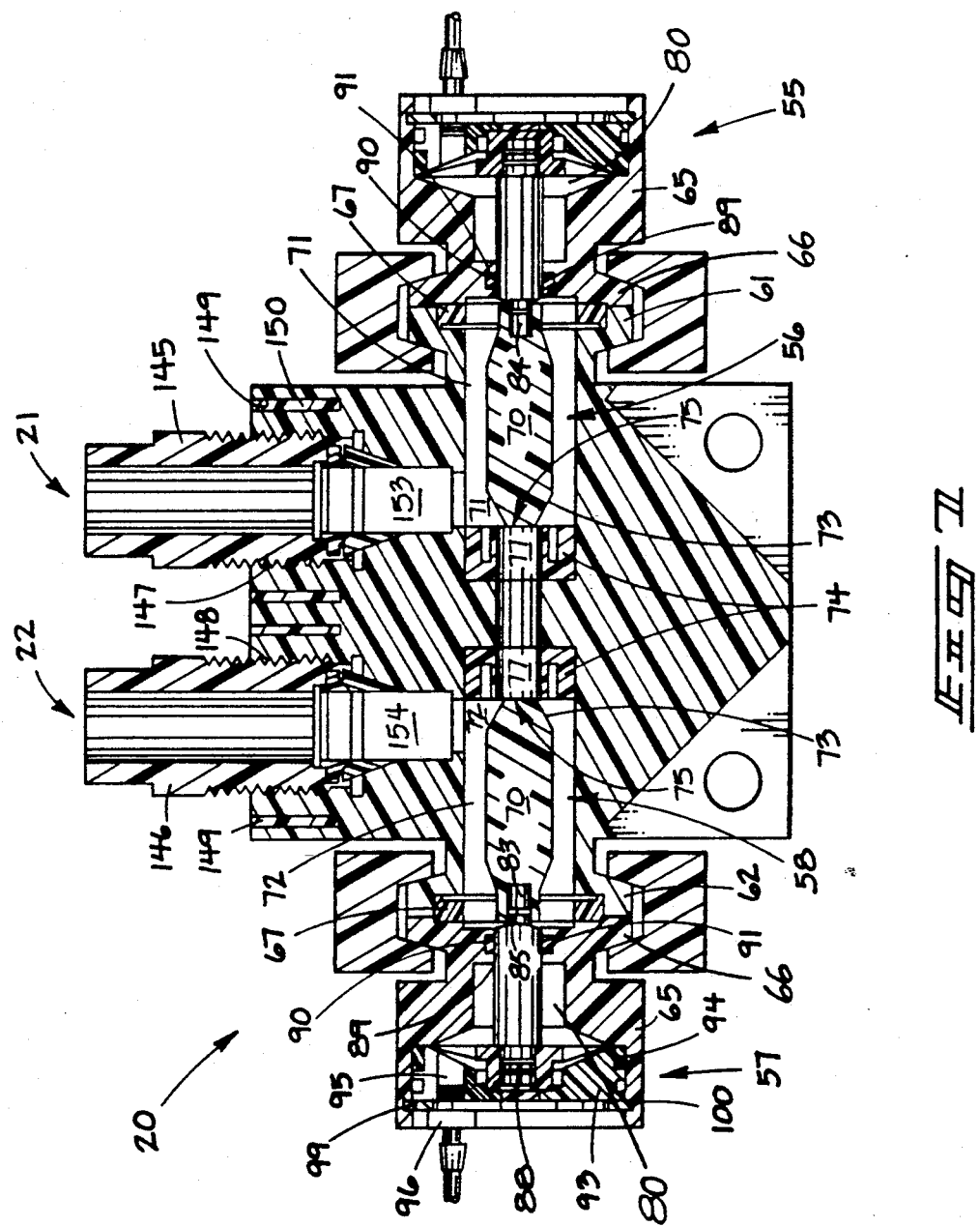
FIG. 7 is an enlarged horizontal sectional view taken substantially along line 7—7 of FIG. 4. The inlet and outlet passages have been shown aligned with line 7—7 for purposes of clear illustration.

FIG. 7 shows that the primary pump housing member 51 is preferably formed with inlet and outlet valve actuator mounting flanges 61 and 62, respectively. Flanges 61 and 62 are adapted for connecting the inlet and outlet valve actuators 55 and 57 to the main pump housing member 51. The valve actuators 55 and 57 each include valve actuator body pieces 65 having mounting flanges 66. Connection of the valve actuators is advantageously accomplished using split mounting rings 63 which have tapered interior grooves 64. The tapered grooves 64 engage tapered back surfaces of the flanges 61 and 62, and tapered back surfaces of the mounting flanges 66. The corresponding halves of split mounting rings 63 are held in position by mounting ring fasteners 68. This tapered flange and ring arrangement forces the mating flanges of the main pump housing and valve actuators together in a tightly sealed arrangement using gaskets 67 or other sealing members.

The inlet and outlet valves 56 and 58 each include a valve piece 70 which is movable in a longitudinal, axial direction within inlet and outlet valve chambers 71 and 72, respectively. Inward motion of the valve pieces 70 cause truncated conical or frusto-conical sealing surfaces 73 on the head of each valve to engage and seal against valve seat members 74. The valve seats are each advantageously constructed with a valve orifice 75 which receives the frusto-conical sealing end of the valve pieces 70. The orifices 75 are advantageously formed by a tubular portion 77 of the valve seat separated from remaining portions by an annular groove 78.

The inlet and outlet valve actuators 55 and 57 are similarly constructed. The actuator body pieces 65 each include a central bore 80 having a number of different sections which mount the internal workings of the actuator. The actuators include actuator stems or stem pieces 81 which are adapted to connect between the outer ends of valve pieces 70 and flexible diaphragm members 82. The connection with the valve pieces is advantageously accomplished using an axial extension 83 on the stem which is received in an end receptacle 84 on each valve piece. The axial extension is advantageously provided with a groove 85 which helps to retain the parts together. The opposite outward ends of the stem pieces 81 are similarly provided with extensions 86 which receive the diaphragms 82 and diaphragm retainer caps 87 thereon. The extensions 86 are preferably provided with two circumferential retaining grooves 88. The central portions of the stem pieces 81 are received through guide apertures 89 formed in the valve actuator body pieces 65. The guide apertures 89 are preferably adapted with small grooves 90 which receive annular stem seals 91.

The valve actuators 55 and 57 further include diaphragm backup pieces 93 which are adapted to engage with the diaphragm retainer caps and prevent mechanical contact of the diaphragms 82. The backup pieces 93 support the outer peripheries of the diaphragms, and are sealed thereagainst using diaphragm periphery seals 94. Retainers 99 hold the backup pieces 93 in position within the actuator body pieces 65 by engaging with a retainer groove 100 formed in the central bore. The backup pieces 93 are provided with actuating fluid contraction passages 95 formed therethrough. The actuating fluid passages are advantageously adapted to receive threaded tubing connection fittings 96 through which pressurized actuation fluid, such as clean dry air, are supplied to force the diaphragms 82 inwardly to seal the valves. The diaphragms are moved outwardly by supplying pressurized actuation fluid through actuating fluid extension passages 97 (see FIG. 5) which are similarly provided with tubing fittings 98.

FIG. 6 shows in further detail the connection of the pumping actuator assembly 53 with pump housing main piece 51. The pump housing main piece 51 is advantageously provided with a pumping actuator mounting flange 102 having a tapered lower or inward flange surface 103. The upper or outward face 104 receives the face of the pumping actuator housing mounting flange 105. The pumping actuator housing 106 also includes a housing extension 107 which is advantageously received within the interior passage of the mounting flange 102.

The pumping actuator assembly 53 also includes a housing end cap 109 which is connected to the main part of housing 106. The end cap is provided with a flange 110 having a tapered outward surface. Flange 110 mates with an upper flange 111 formed on the actuator housing 106. Flange 111 has a tapered lower surface. The flange pairs 110,111 and 102,105 are joined together by a two part split ring construction similar to that described hereinabove for the valve actuators. The flange pairs are received within tapered grooves 112 formed by mounting rings 113 using fasteners 108. This arrangement clamps the flange faces together. A suitable seal such as O-ring seal 114 is advantageously included between cap 109 and housing 106. Sealing also occurs between the lower end face 115 of housing 106 and the main housing 51 using the bellows retaining flange 138 integrally formed from the lower end of flexible bellows 60.

The interior of the pumping actuator is preferably divided into motor chamber 116 and bellows chamber 117. The motor chamber 116 is constructed to accommodate a fluid powered actuation motor 118. The motor 118 includes a cylinder liner 119 which receives a piston 120 which is slidable therein in an axial longitudinal direction, up and down as shown in FIG. 6. Leakage between the piston and cylinder is sealed using two piston rings 121 which are received within suitable receiving grooves 122 formed in the sidewalls of the piston. The piston is connected to a connecting rod 123. Piston 120 bears against a mounting shoulder on connecting rod 123 and is retained thereagainst using a nut 124 which is threaded onto a piston mounting extension 125 of the connecting rod 123. The end of the extension section 125 is advantageously provided with a screw driver slot 126 to aid in assembly and disassembly.

The connecting rod 123 is slidably received through a connecting rod aperture 127 formed through a housing bulkhead 128 which separates the motor chamber from the bellows chamber 117. The aperture 127 is advantageously provided with a sealing groove 129 which receives a sealing member 130. The bellows chamber 117 is preferably provided with a combination vent and drain 144 which is preferably connected to a building or other facilities drain system capable of handling potential discharges of the process fluids being blended.

The upper end of piston 120 is designed to contact against an annular stop member 131. Stop member 131 is mounted to the inside of cap 109 using suitable means, such as fasteners 132. The stop member is contacted by piston 120 when the piston is in the fully extended position. The lower end of piston 120 contacts the upper side of bulkhead 128 when the piston is in the fully retracted position.

The inward or lower end of connecting rod 123 is adapted for connecting to the bellows 60 using a connecting rod bellows flange 133. The connecting rod bellows flange 133 mates with a bellows connecting flange 134. These flanges are connected by split connection rings 135 in a manner similar to other flange connections described hereinabove.

The bellows 60 is provided with a bellows head 136 which connects the bellows upper flange 134 to the bellows accordion portion 137. The lower end of bellows 60 is provided with a bellows retaining flange 138 which keeps the lower end in position relative to the housing. The upper end of bellows 60 is movable with the connecting rod 123 and piston 120. The interior 142 of the bellows is advantageously fitted with a bellows interior piece 139. Interior piece 139 is cylindrical and held by a receptacle 139a formed in the interior of bellows head 136 to receive a mounting extension 140 forming a part of interior piece 139. The bellows interior piece serves to support the bellows accordion and reduce the displacement of the bellows interior when the bellows accordion is expanded and contracted. The bellows is preferably made in sufficient length relative to the stroke of piston 120 so that from the median position of the movable bellows head, there is a 60 percent decrease in bellows length and a 40 percent increase in bellows length, as the bellows moves from the fully contracted to fully expanded conditions. This minimizes stress in the bellows and reduces the sloughing of bellows material into the processing fluid being pumped. This is significant in maintaining low contamination for semiconductor processing.

The pumping chamber 59 is partially defined by the interior of the bellows and the bellows interior piece 139, and also by a pumping chamber recess 141 formed in upper surfaces of the primary pump housing piece 51. The pumping chamber is further defined by a T-shaped pumping chamber passageway 143 which connects the bellows interior with the inlet and outlet valve orifices.

FIGS. 6 and 7 show that the inlet 21 and outlet 22 of pump 20 are advantageously provided with an inlet fitting 145 and outlet fitting 146, respectively. The fittings 145 and 146 facilitate the connection of supply line 15 and outflow line 23 (see FIG. 1). The fittings are received in threaded inlet and outlet receptacles 147 and 148 formed in the housing piece 51. The receptacles 147 and 148 are advantageously isolated from remaining portions of the housing piece by annular isolation grooves 149 which are advantageously fitted with reinforcement inserts 150. This structure provides a preferably polymer threaded receptacle for superior sealing with fittings 145 and 146, enhanced by superior mechanical integrity. Sealing of the fittings 145 and 146 is further enhanced by a sealing ring structure including a tapered first ring 151 which receives a second tapered sealing ring 152 (FIG. 6). The second ring swages the first outwardly and forms a tight seal with the housing piece 51.

The housing piece 51 includes an inlet chamber 153 which is in fluid communication with the inlet valve chamber 71. Similarly, housing piece 51 includes an outlet chamber 154 which is in fluid communication with the outlet valve chamber 72.

FIG. 8 shows a preferred construction of control system for the blending system 10 of FIG. 1. The control system includes an electronic controller 155 which is electrically connected to provide control signals to two solenoid operated control valves 156 and 157. Control valves 156 and 157 receive pressurized air or other actuation media via an adjustable pressure regulator 159. A pressure gauge 160 is advantageously included to indicate the pressure to a pneumatic distribution manifold and control valves 156 and 157. Control valves 156 and 157 are preferably 3-way valves each having two pneumatic outputs. First control valve 156 has outputs 161 and 162. Similarly, second solenoid operated pneumatic control valve 157 has two outputs 163 and 164. Control valves 157 and 158 are advantageously mounted in a manifold block 158. Manifold block 158 is supplied with compressed gas, such as clean, dry air or nitrogen preferably through an adjustable pressure regulator 159. When control valve 156 is activated then pressurized gas is supplied to output 161. When control valve 156 is not activated then pressurized gas is supplied to output 162. When control valve 157 is activated then pressurized gas is supplied to output 163. When control valve 157 is not activated then pressurized gas is supplied to output 164. The non-pressurized outputs are automatically bled of residual pressure by bleed ports on each valve (not shown). A pressure gauge 160 can advantageously be included to indicate the pressure of the gas supplied to manifold 158.

The pneumatic control fluid outputs 161-164 are connected to pneumatic control lines 165-168, respectively. Control lines 165 and 166 are connected to the pump actuator motor at fittings 166 and 167, respectively, to thus apply pressure at the top of piston 120 when valve 156 is activated. Control line 167 is connected to the extension side fitting 98 of the inlet valve actuator 55 to thus cause the inlet valve 56 to open when control valve 157 is activated. Control line 167 is also connected to the contractionary fitting 96 of the outlet valve actuator 57 thus causing the outlet valve to be closed when control valve 157 is activated. Conversely, the control line 168 is connected to the extension fitting of the outlet valve 58, and to the contractionary fitting of the inlet valve. Because of the control fluid in lines 167 and 168 are substantially out of phase this causes the inlet and outlet valves to be operated in an opposite and substantially complementary manner. The electronic controller 155 coordinates the operation of the inlet and outlet valves with respect to the operation of the bellows 60.

FIG. 8 also shows that electronic controller 155 is connected to provide output control signals to the recycle control valve 27 and the fluid delivery control valve 29. This can be done directly by using electrical solenoid operated control valves for valves 27 and 29. Alternatively and more preferably, the valves 27 and 29 can be pneumatically actuated, in which event intervening solenoid operated pneumatic control valves 27a and 29a would be included to control the flow of actuating gas to the process fluid control valves 27 and 29.

The pump and associated parts described above preferably are made of fluorocarbon polymer, such as TEFLON or other PTFE, or other suitable materials as needed for the particular process fluids being used. The parts are formed into the indicated parts using standard materials working techniques such as machining or molding. The various seals used and identified above can similarly be selected from commercially available materials dependent upon the chemical process fluids being used.

The pumping and blending systems according to this invention are advantageously operated to provide novel low contamination operation capable of delivering accurate amounts of relatively small quantities of process fluids. The operation will be described generally with respect to the blending system shown in FIG. 1. The process controller 155 sequences through the desired operational steps of the semiconductor processor until the appropriate time when blending of process chemicals is desired. Controller 155 causes de-ionized water or other process fluid to be supplied through valve 32 by opening the valve. Valve 32 can either be directly operated by an electrical solenoid, or operated pneumatically using an interposed pneumatic actuating control valve 32a which supplies actuating gas to valve 32. Valve 32 is opened for a predetermined period of time or otherwise controlled to provide a desired amount of water in blending container 30. Alternatively, the water or other process fluid supplied through valve 32 can be provided using a metering system similar to that shown supplying fluid to valve 29 and valve 32 functions in a manner the same as valve 29.

The metering portion or portions of blending system 10 are controlled to initiate operation of metering pump 20 with recycle control valve 27 opened to thus allow process fluid 12 to be recycled to reservoir 11 during a startup period. The metering pump 20 operates in the following manner. The electronic controller 155 activates the solenoid valve 156 thus causing actuating gas to flow from the manifold 158 through pneumatic control line 165 to fitting 170 on the bellows actuator. The actuating compressed gas causes the piston and connected head 136 of bellows 60 to move upwardly. The control valve 157 is also activated shortly thereafter to thus cause the inlet valve 56 to be opened by supplying the control gas to the actuating fluid extension passage 97 of the inlet valve actuator 55. The positive displacement increase of the bellows and pumping chamber thus draw process fluid from reservoir 11 through supply line 15, fitting 21, inlet chamber 153, inlet valve chamber 71 and into the passageway 143. As the piston 120 is fully extended upwardly, the controller 155 deactivates the solenoid operated valve 157 thus closing the inlet valve 55 and opening the outlet valve 57. Similarly, control valve 156 is deactivated to apply pneumatic pressure to the upper end of piston 120 to thus cause the piston and connected bellows head 136 to move downwardly. The contractionary movement of the bellows head decreases the volume of the pumping chamber 59 and displaces process fluid out through the outlet valve chamber 72, outlet chamber 154, and through fitting 22 to outflow line 23.

The above process is repeated using the positive electronic control provided by controller 155 for a predetermined number of startup cycles in order to assure that the pump is fully primed and all process fluid conduits are full. For example, the recycle part of the operational sequence may be advantageously repeated for 5 or more cycles, more preferably 5-20 or more cycles. During this recycle part of the operational method the process fluid 12 is routed only to reservoir 11 because controller 155 has caused recycle valve 27 to be open and delivery valve 29 to be closed. The recycle operation is preferably preprogrammed into controller 155 to occur automatically up initial operation of the pump 20. Once the recycle part of the method is sufficiently completed to eliminate startup flow variations and fill all process fluid lines, then recycle valve 27 is closed and delivery valve 29 is opened. This change is preferably accomplished during the start of a bellows compression stroke. The controller thereafter tallies the number of pump cycles which occur and automatically delivers a desired preprogrammed amount of process fluid 12 through delivery valve 29 into blending container 30. The amount of process fluid 12 delivered is thus accurately determined and automatically delivered to produce an automatic blending process according to this invention.

It should also be understood that pump 20 can be operated in a reverse pumping mode. In this reverse operation the inlet and outlets are reversed and the operation of the pump motor is properly coordinated to achieve reverse pumping in a manner similar to the operation described above. Reverse pumping can be used to remove fluid from the fluid conduits back to the supply reservoir.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A semiconductor processor blending system for blending and delivering a blend, mixture or similar combination of at least two liquid semiconductor processing components including at least a first component and a second component, comprising:
   at least one first component supply container for holding a supply of the first component;
   at least one second component supply container for holding a supply of the second component;
   a controller for providing control signals;
   at least one metering pump connected to receive a supply of the first component from the first component supply container; said metering pump having a flexible bellows movably mounted within a pump housing; said metering pump further having at least one pneumatically controlled inlet valve and at least one pneumatically controlled outlet valve; said pneumatically controlled inlet valve being connected to control supply of the first component to said flexible bellows; said pneumatically controlled outlet valve being connected to control outflow of said first component as forced by the flexible bellows; said metering pump also having a bellows actuator which is pneumatically powered and connected to actuate and move said flexible bellows; said bellows actuator and said controlled inlet and controlled outlet valves being independently controlled by said controller to properly time the operation of the controlled inlet and controlled outlet valves relative to the movement of the flexible bellows;
   at least one recycle line connected to convey fluid from said controlled outlet valve of the pump to said first component supply container to thereby allow recycle of first component;
   recycle control valve means for controlling flow of said first component through said recycle line; said recycle control valve means being controlled by said controller;
   at least one blending container connected to receive outflow of the first component from the metering pump; said blending container also being connected to receive said second component to produce a blend of said first and second components;
   delivery control valve means for controlling delivery of first component from said controlled outlet valve of the pump to said at least one blending container; said delivery control valve means being controlled by said controller.

2. A semiconductor processor blending system according to claim 1 and further defined by said controller including means for providing automatic initial recycle to the first component supply container during an initial phase of metering pump operation followed by delivery of first component to the blending container.

3. A semiconductor processor blending system according to claim 1 wherein there are a plurality of said metering pumps for accurately and independently delivering at least the first and second components to the at least one blending container.

4. A metering pump for accurately delivering fluid from a supply container to an outflow container, comprising:
   a pump housing;
   an inlet for receiving fluid to be pumped;
   an outlet for delivering fluid being pumped;
   a flexible bellows displacement element movably mounted within the pump housing to define a pumping chamber having a variable displacement dependent upon movement of the flexible bellows displacement element;
   an electronic controller for controlling operation of the pump;
   a controlled inlet valve, said controlled inlet valve being connected between the inlet and the pumping chamber to control supply of fluid to the pumping chamber from the inlet;
   a pneumatic inlet valve actuator mechanically connected to the controlled inlet valve to operate the inlet valve into open and closed positions;
   a inlet valve solenoid connected to the electronic controller and a source of pneumatic gas to controllably provide pneumatic gas to the pneumatic inlet valve actuator;
   a controlled outlet valve, said controlled outlet valve being connected between the pumping chamber and the outlet to control outflow of fluid from the pumping chamber forced by the flexible bellows displacement element;
   a pneumatic outlet valve actuator mechanically connected to the controlled outlet valve to operate the outlet valve into open and closed positions;
   an outlet valve solenoid connected to the electronic controller and a source of pneumatic gas to controllably provide pneumatic gas to the pneumatic outlet valve actuator;
   a bellows actuator which is connected to actuate and move said flexible bellows displacement element; said bellows actuator being pneumatically driven;
   a bellows actuator solenoid connected to the electronic controller and a source of pneumatic gas to controllably provide pneumatic gas to the bellows actuator;
   whereby said bellows actuator and said controlled inlet and controlled outlet valves are independently controlled by the controller to properly time the operation of the controlled inlet and controlled outlet valves relative to the movement of the flexible bellows displacement element.

5. A metering pump according to claim 4 and further comprising a bellows piece mounted within the bellows and pumping chamber to decrease the displacement of the pump.

6. A metering pump according to claim 4 wherein the displacement element is a bellows made of polymer.

7. A process for accurately blending at least two liquid components including at least a first component and a second component, comprising:

supplying a desired quality of the component from a first component supply container to a blending container;

opening a recycle valve means to allow recycle flow of second component from a second component supply container through a pump and back to said second component supply container;

pumping second component in said recycle flow using said pump which performs a pumping process comprising:

controlling an outlet valve solenoid to control pneumatic gas to an outlet valve actuator;

closing an outlet valve into an outlet valve closed position using said outlet valve actuator;

controlling an inlet valve solenoid to control pneumatic gas to an inlet valve actuator;

opening said inlet valve using said inlet valve actuator into an inlet valve open position;

controlling a bellows actuator solenoid to control pneumatic gas to a pneumatic bellows actuator;

actuating a pump bellows member using said bellows actuator to increase displacement of a pumping chamber;

controlling said inlet valve solenoid to control pneumatic gas to said inlet valve actuator;

closing the inlet valve into an inlet valve closed position using the inlet valve actuator;

controlling said outlet valve solenoid to control pneumatic gas to said outlet valve actuator;

opening said outlet valve into an outlet valve open position using said outlet valve actuator;

controlling said bellows actuator solenoid to control pneumatic gas to the pneumatic bellows actuator;

actuating said pump bellows member using said bellows actuator to decrease displacement of a pumping chamber and discharge second component through the outlet valve;

continuing said recycle flow for sufficient time to fill second component conduits with second component and remove entrained gas therefrom;

closing said recycle valve means to discontinue recycle flow;

opening a fluid delivery valve means which controls delivery of second component to said blending container;

pumping second component to said blending container using said pumping process defined hereinabove;

counting to indicate discharge cycles of the pump bellows after opening of the fluid delivery valve means to indicate the flow of the second component into the blending container;

controlling discharge of second component into the blending container using information from said counting step.

8. A process according to claim 7 wherein said opening, actuating, and closing steps are accomplished by sending control signals from an electronic controller to solenoids which cause effectuation of said opening, actuating, and closing steps.

* * * * *